(12) United States Patent
Meysenc et al.

(10) Patent No.: US 6,734,543 B2
(45) Date of Patent: May 11, 2004

(54) MODULE HOUSING AND POWER SEMICONDUCTOR MODULE

(75) Inventors: Luc Meysenc, Baden-Dättwil (CH); Amina Hamidi, Baden (CH); Pieder Joerg, Domat/Ems (CH); Alper Akdag, Baden-Rütihof (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 10/315,087

(22) Filed: Dec. 10, 2002

(65) Prior Publication Data

US 2003/0116841 A1 Jun. 26, 2003

(30) Foreign Application Priority Data

Dec. 24, 2001 (EP) .............................................. 01811273

(51) Int. Cl.[7] ................................................ H01L 23/48
(52) U.S. Cl. ......................................... 257/690; 257/730
(58) Field of Search ........................ 257/678, 690–691, 257/698, 730

(56) References Cited

U.S. PATENT DOCUMENTS 4,694,322 A * 9/1987 Sakurai et al. ................ 357/74

* cited by examiner

*Primary Examiner*—Roy K Potter
(74) *Attorney, Agent, or Firm*—Burns, Doane, Swecker & Mathis, L.L.P.

(57) ABSTRACT

The power module housing comprises two electrically insulating housing elements (1, 2) that are attached to each other. A first of said housing elements (2) comprises at least two openings (24) for electric power terminals (31, 32) and a slot-like recess (23). Between the openings (24) three insulating walls (11, 21, 22) are arranged on and perpendicular to a surface of the housing. One insulating wall (11) is part of a second of said housing elements (1) and is inserted into the recess (23) in said first housing element (2), while an at least one second of said insulating walls (21, 22) is part of the first housing element (2). The insulating walls between the openings for the power terminals allow a compact arrangement of the terminals.

5 Claims, 2 Drawing Sheets

MODULE HOUSING AND POWER SEMICONDUCTOR MODULE

FIELD OF THE INVENTION

This invention relates to the technical field of power electronics. It relates to a module housing according to the preamble of patent claim 1 and to a Power Semiconductor Module.

BACKGROUND OF THE INVENTION

The development of IGBT (Insulated-Gate Bipolar Transistor) modules evolved from established Darlington transistor modules, which were the workhorse of the low voltage drives industry during the last two decades of the last century. Initially manufacturers simply replaced the Darlington chips with IGBT chips. This led to a diversity of packaging types in so-called "standard modules". The lowest power devices tended to be in the 6-pack or full 3-phase bridge configuration. Higher current rated devices used the 2-pack or half-bridge configuration, while the highest current ratings were made in 1-packs (an IGBT with anti-parallel fast diode). This combination of evolution from bipolar modules with a diversified range of packages left a fragmented supply base, with a bewildering range of almost interchangeable modules. Suppliers were reluctant to move to standard solutions and invest in new tooling of packaging. Furthermore the old bipolar-derived packaging had a number of limitations when used with faster switching MOS gated IGBTs.

New generations of modules emerged, and there has been a great diversification in packaging, particularly in the low power range, with the suppliers introducing new concepts with higher levels of integration, usually aimed at particular parts of the market. By introducing more functionality into the devices suppliers are not necessarily able to produce a standard module in two senses of the word "standard". Firstly the additional functionality limits the area of application of the module. Secondly the standardization required by most users, namely multiple-sourcing, is more difficult to achieve between suppliers with different technology platforms.

In the lowest power range of the market the Econopacks as described in M. Feldvoβ et al, "A new compact inverter concept with low profile solderable ECONOPACK modules", *Powersystems World '96 Conference, PCIM*, Sep. 7–13, 1996, Las Vegas, were introduced and eventually reached the definition of a standard module: manufactured by more than one supplier and used by many customers. However until the introduction of LoPak, as described in S. Dewar et al, "The Standard Module of the 21$^{st}$ Century", ABB Semiconductors AG online documentation (www.absem.com), there was no new standard module, designed specifically for use with IGBT technology, above the 100A 6-pack rating. Conventional low power high voltage applications (line voltages above 3 kV) are controlled by GTOs (Gate Turn-Off Thyristors), IGCTs (Integrated Gate-Controlled Thyristor) or IGBTs. The IGBT, a device with several advantages compared to the thyristor-structured power semiconductors, e.g. low requirements regarding the driving unit, easy cooling resulting from the insulated structure, is fully developed and introduced for blocking voltages up to 6.5 kV. IGBT-Modules with blocking voltages of 4.5 or 6.5 kV have first been designed for traction inverters and have then been used for industrial drives as well as for power quality applications. The packaging kept the same standards as for lower voltage modules (1.2, 2.5 or 3.3 kV). All these modules have standard footprints, overall dimensions and terminal positions. Hence, all the creepage and clearance distances are identical and they all have the same electrical insulation. A 6.5 kV IGBT-Module is described in F. Auerbach, et al, "6.5 kV IGBT-Modules", EUPEC online documentation (www.eupec.com)., For applications requiring even higher voltages series-connection of several modules is necessary. One possible way to reduce costs for these kinds of applications is to series-connect IGBT semiconductor chips inside a module, leading to modules with twice or three or even more times the blocking voltage of the highest voltage modules available today. However, for these high voltage modules conventional packaging design rules as applied in the LoPak modules have proven not be sufficient to ensure full insulation without any dielectric stress in critical areas of the module housings, e.g. glued junctions between two housing elements such as housing walls and covers.

SUMMARY OF THE INVENTION

It is therefore an object of the present invention to provide a module housing and a power semiconductor module of the initially mentioned kind with improved dielectric strength and increased blocking voltage capability.

This object is achieved with a module housing according to claim 1 and a power semiconductor module according to claim 4.

The inventive module housing comprises two electrically insulating housing elements that are attached to each other. A first of said housing elements comprises at least two openings for electric power terminals and a slot-like recess. Between the openings at least two insulating walls are arranged on and perpendicular to a surface of the housing. An at least one first of said insulating walls is part of a second of said housing elements and is inserted into the recess in said first housing element, while an at least one second of said insulating walls is part of the first housing element.

The insulating walls between the openings for the power terminals allow a compact arrangement of the terminals.

In a preferred embodiment of the inventive module housing, said second housing element with said first insulating wall being inserted into said recess and said first housing element are joined by a glued junction. This glued junction is separated from at least one of said openings by at least one of said second insulating walls.

The glue is not on the electrical clearance or creepage path between the power terminals in the openings. Any electrical field can therefore be applied to the glued junction, the path is always interrupted by at least one insulating wall between the junction and at least one of the terminals.

Further embodiments emerge from the depending claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
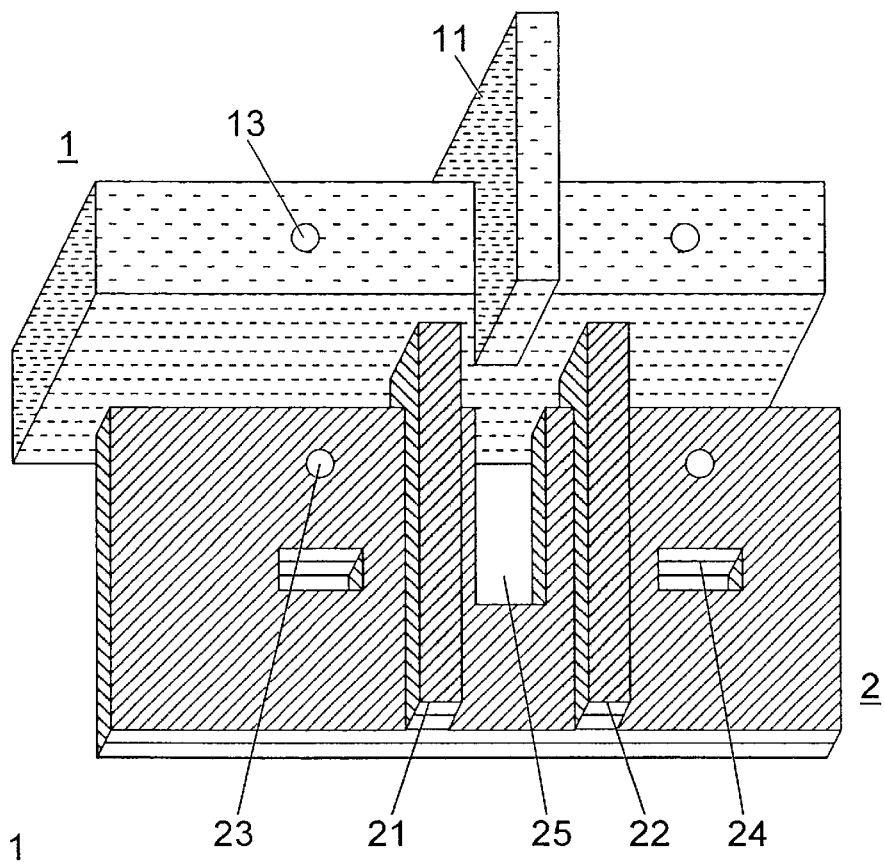
FIG. 1 shows part of the inventive module housing with two housing elements, before joining the housing elements.

Referring now to the drawings, wherein like reference numerals designate identical or corresponding parts throughout the several views.

FIG. 1 shows a first embodiment of the inventive module housing. Housing wall 1 and cover 2 are designed to fit together. The housing wall 1 is shown only partially in the drawing. The entire housing wall has preferably a rectangular shape surrounding a base plate on which e.g. semiconductor chips are mounted. The cover 2, which is also shown only partionally, is designed to tightly fit on top of the housing wall, ensuring full insulation of the module housing. Housing cover and wall are glued together, forming a tight module housing. On top of the housing wall 1 a small insulation wall 11 is arranged perpendicular to the top surface of the housing wall. As shown in the drawing, the insulation wall 11 overlaps the housing wall towards the inside of the module.

The cover 2 has a slot-like recess 23 which opens towards the outside of the module. Said insulation wall 11 slides into the recess when the cover 2 is put on top of the housing wall 1.

Figure 2:
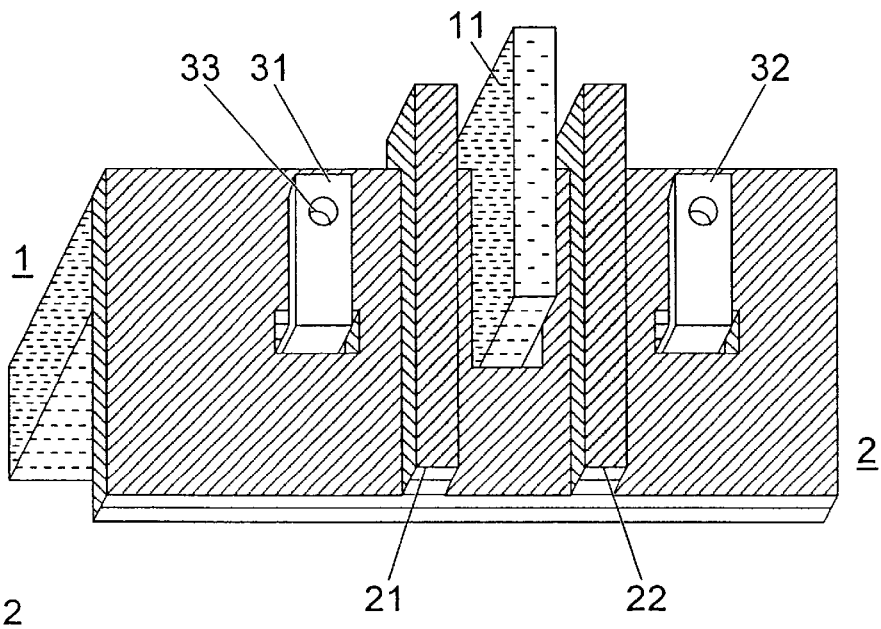
FIG. 2 shows the module housing of FIG. 1, with the housing elements attached to each other and with power terminals.

FIG. 2 shows the housing wall 1 and the cover 2 being attached to each other. The cover 2 surrounds the insulation wall 11 which is located in the recess 23.

The cover 2 comprises two openings 24 for inserting power terminals 31 and 32 for contacting the semiconductor chips arranged inside the module. These openings are arranged on both sides of the recess 23.

On the cover 2, there are additional insulation walls 21 and 22 standing perpendicular on top of the cover-surface and running parallel to the recess 23. These cover insulation walls 21 and 22 are arranged on both sides of the recess 23 between the recess and the openings 24 for the power terminals 32. The cover insulation walls 21 and 22 are longer than the insulation wall 11 in-between them, they might even extend across the entire cover. In the housing wall 1, the cover 2 and the power terminals 31 and 32 there are clamping holes 12, 25 and 33 through which a bolt or a screw 52 is led for attaching an external connector 4 to the power terminals, as shown in the next two Figures.

Figure 3:
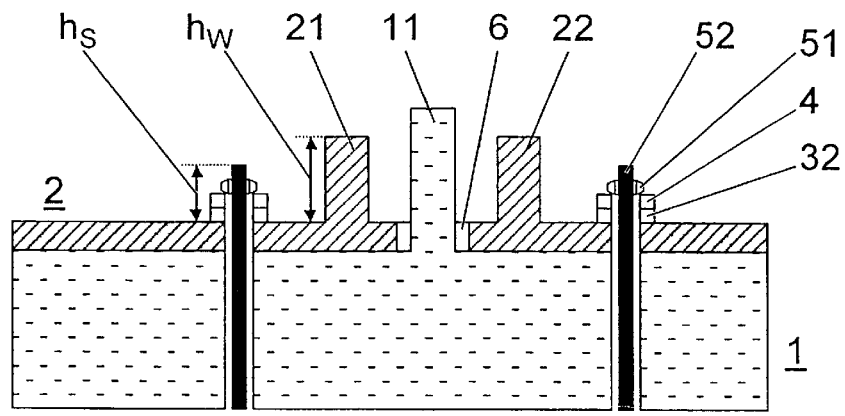
FIG. 3 shows a cross-sectional view of the module housing of FIG. 2.

FIG. 3 shows a cross-sectional view of the first embodiment of the inventive module housing according to the previous Figures. It shows the housing wall 1 and the cover 2 being firmly attached to each other. Between the insulation wall 11 and the cover 2, there is a glued junction 6 in the recess. Cover insulation walls 21 and 22 are shielding this glued junction, keeping the electrical creepage and clearance path away. It is therefore advantageous, that the height $h_w$ of the insulation walls, especially of the walls between the power terminals 32 and the glue-junction 6 is at least equal to the height $h_s$ of the stack of power terminal 32, connection bar 4 and whatever clamping element is used, e.g. bolt 52 and nut 51.

Figure 4:
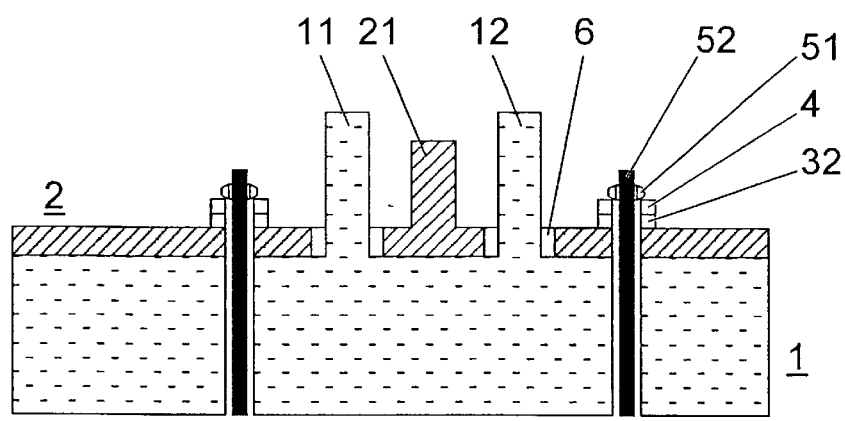
FIG. 4 shows a cross-sectional view of an alternative embodiment of the module housing of FIG. 2.

FIG. 4 shows a cross-sectional view of a second embodiment of the inventive module housing. There are two insulation walls 11 and 12 arranged on the housing wall 1 but only one cover insulation wall 21. For the two insulation walls 11 and 12 there are corresponding recesses in the cover arranged on both sides of the cover insulation wall 21. The glued junction is one very critical point from the dielectric point of view. As it is difficult to characterize the dielectric behavior of a layer of glue, it is safer to limit the electrical field in the layer. With the inventive module housing, there is always at least one insulation wall between a glued junction and one of the power terminals.

A power semiconductor module with the inventive module housing is expected to be partial discharge free for terminal to terminal blocking voltages up to at least 16 kV. Possible applications for the inventive module housing are high voltage power electronic modules, e.g. power electronic modules with series connected chips, used in power quality equipment or medium voltage drives.

The housing elements including the insulation walls are made of an electrically insulating material, e.g. epoxy.

List of Reference Signs 1 housing
11, 12 housing insulation wall
13 clamping hole
2 cover
21, 22 cover insulation wall
23 clamping hole
24 terminal hole
25 recess
31, 32 power terminal
33 clamping hole
4 connection bar
41 cathode contact
51, 52 clamping element, bolt and nut
6 glue
$h_s$ height of terminal stack
$h_w$ height of wall

What is claimed is:

1. Module housing, comprising at least two electrically insulating housing elements;

said housing elements being attached to each other;

a first of said housing elements comprising at least two openings for electric power terminals;

between said openings at least two insulating walls being arranged on and perpendicular to a surface of said housing;

an at least one first of said insulating walls being part of a second of said housing elements, said first insulating wall being inserted into a slot-like recess in said first housing element;

wherein an at least one second of said insulating walls is part of the first housing element.

2. Module housing of claim 1, wherein at least three insulating walls are arranged on the surface of said housing, two of the insulating walls being part of one of the housing elements and being arranged on both sides of a third insulating wall, said third insulating wall being part of the other housing element.

3. Module housing of claim 1, wherein said at least one first insulating wall is inserted into said recess and said first housing element are joined by a glued junction, said glued junction being separated from at least one of said openings by at least one of said second insulating walls.

4. Module housing of claim 1, wherein the module comprises a housing wall and a cover, one of said housing elements being the cover and the other one of said housing elements being the housing wall.

5. Power semiconductor module, comprising a module housing of claim 1, and at least one high power semiconductor chip with at least two main electrodes, said electrodes being connected to at least two power terminals, said power terminals being arranged in said openings for external electrical contacting.

* * * * *